United States Patent [19]
Tarutani et al.

[11] 4,319,256
[45] Mar. 9, 1982

[54] JOSEPHSON JUNCTION ELEMENT

[75] Inventors: Yoshinobu Tarutani, Uenohara; Hirozi Yamada, Hachioji; Ushio Kawabe, Hamuramachi, all of Japan

[73] Assignee: Hitachi, Ltd., Tokyo, Japan

[21] Appl. No.: 146,163

[22] Filed: May 2, 1980

[30] Foreign Application Priority Data

May 16, 1979 [JP] Japan ................. 54/64227

[51] Int. Cl.³ ........................................... H01L 27/12
[52] U.S. Cl. ............................................ 357/5; 357/4
[58] Field of Search ....................................... 357/5, 4

[56] References Cited

U.S. PATENT DOCUMENTS

| 3,999,203 | 12/1976 | Lahari | 357/5 |
| 4,012,756 | 3/1977 | Chaudhari | 357/5 |
| 4,145,699 | 3/1979 | Hu | 357/5 |
| 4,157,555 | 6/1979 | Gray | 357/5 X |
| 4,176,365 | 11/1979 | Kroger | 357/5 |
| 4,220,959 | 9/1980 | Kroger | 357/5 |

Primary Examiner—Martin H. Edlow
Attorney, Agent, or Firm—Craig and Antonelli

[57] ABSTRACT

A sandwich-type Josephson junction element wherein a counter electrode is made of a Mo-Re alloy which contains 10–90 atomic-% of Re. The Josephson junction element has a high operating temperature, and any deterioration thereof attributed to a thermal cycle is not noted.

8 Claims, 2 Drawing Figures

JOSEPHSON JUNCTION ELEMENT

BACKGROUND OF THE INVENTION (i) Field of the Invention

This invention relates to sandwich-type Josephson junction elements, and more particularly to a sandwich-type Josephson junction element which is free from any deterioration due to a thermal cycle and which has a high operating temperature.

(ii) Brief Description of the Prior Art

A superconducting tunneling junction having the Josephson effect can give rise to the transition between the zero voltage and a finite voltage by controlling a magnetic field. Since the switching time in this case lies in a range of 10–100 p.s., the Josephson junction is extraordinarily excellent as a switching element. Therefore, the utilization as an element for operation or storage in an electronic computer has been expected of the Josephson junction element. Besides, many uses including the application as an electromagnetic wave detector etc. have been revealed.

The shape of the Josephson junction has several types. Among them, the sandwich-type junction in which a voltage in the normal state is independent of currents or magnetic fields is suitable for use in a logic circuit. Pb. and a Pb.-based alloy have heretofore been employed for the superconductive electrodes of the sandwich-type junctions. The materials Pb. and Pb.-based alloy have the advantage that the junctions are readily formed. The Josephson elements employing them, however, have the difficulty that a hillock appears in a base electrode due to the thermal cycle between a room temperature and a liquid helium temperature and tears an oxide barrier layer to deteriorate the Josephson voltage-current characteristics. Moreover, since the critical temperature of the material forming the electrode is as low as about 7° K., it is difficult to make the operating temperature of the element about 5° K. or higher. At the operating temperature of about 5° K., the Josephson junction element cannot be operated by cooling it with a closed cycle cryogenic refrigerator, and it needs to be immersed in liquid helium in order to operate it.

Nb. has also been known as a material for the superconductive electrode of the sandwich-type Josephson junction element. The material Nb. does not undergo the hillock unlike the materials Pb. and Pb.-based alloy, and the critical temperature thereof is about 2° K. higher than that of Pb. and is about 9° K., so that it is more excellent than Pb. and the Pb.-based alloy as the material for the electrode of the Josephson junction element. However, even the Josephson junction element employing Nb. for the electrode has an operating temperature of about 6° K. It cannot be operated by cooling it with the closed cycle cryogenic refrigerator, and still requires the cooling with liquid helium.

As superconductive materials exhibiting high critical temperatures, there have been known a large number of materials including $Nb_3Sn$, $Nb_3Ge$, $V_3Si$ etc., all of which have critical temperatures higher than that of Nb. It seems that, if electrodes are made of these materials, Josephson junction elements which can be operated by the cooling with the closed cycle cryogenic refrigerator will be produced. In actuality, however, in case where such a material is evaporated onto a barrier layer as a counter electrode, the substrate temperature or the temperature of a composite body consisting of a base electrode and the barrier layer needs to be set at several hundred °C. or above. When the counter electrode material is deposited at such high temperatures, the barrier layer and the deposited electrode material react, or pinholes appear in the barrier layer, with the result that a good Josephson junction effect as expected is not attained. On the other hand, even when the material such as $Nb_3Sn$. is evaporated onto the barrier layer at a substrate temperature lower than about 500° C., an electrode of high critical temperature is not produced. Accordingly, even when these materials are applied to the counter electrodes of the sandwich-type Josephson junction elements, the produced elements cannot be operated by the cooling with the closed cycle cryogenic refrigerator.

In this manner, it can be said that any sandwich-type Josephson junction element capable of operating by cooling it with the closed cycle cryogenic refrigerator without the use of liquid helium has not heretofore been known. The performance of the present-day closed cycle cryogenic refrigerator is approximately 6.5°–9° K. in terms of the cold end temperature at the zero refrigeration capacity, approximately 8.2°–9.8° K. at a refrigeration capacity of 0.5 W, and approximately 9°–10° K. at a refrigeration capacity of 1 W. It turns out that the Josephson junction element operable by the cooling with the closed cycle cryogenic refrigerator must have an operating temperature of about 8.5° K. or above.

If elements whose operating temperatures are below 8.5° K. and which require the cooling with liquid helium have operating temperatures higher than those of the conventional elements, the cooling thereof will be facilitated to that extent. Needless to say, therefore, such Josephson junction elements are also useful.

The following references are cited to show the state of the art: (i) Japanese Patent Application Laid-open Specification No. 47-13274, (ii) Japanese Patent Application Laid-open Specification No. 52-97695, (iii) Japanese Patent Application Laid-open Specification No. 53-53298.

SUMMARY OF THE INVENTION

This invention has for its object to provide a sandwich-type Josephson junction element which is free from any deterioration due to a secular change or a thermal cycle and which has a high operating temperature, and has for its further object to provide a sandwich-type Josephson junction element which can be operated by cooling with a closed cycle cryogenic refrigerator and which has a long lifetime.

In order to accomplish the objects, this invention consists in a sandwich-type Josephson junction element having a base electrode which is made of a superconductive material, a barrier layer which is formed of an insulating film and/or semiconductor film deposited on the base electrode, and a counter electrode which is made of a superconductive material disposed on the barrier layer, characterized in that said counter electrode is made of a Mo.-Re. alloy which contains 10–90 atomic-% of Re.

A more preferable range of the Re. content of the Mo.-Re. alloy forming the counter electrode is 20–80 atomic-%, and the most preferable range of the Re. content is 35–50 atomic-%. The critical temperature of the Mo.-Re. alloy whose Re. content is 10 atomic-% or 90 atomic-% is approximately 7° K. Mo.-Re. alloys whose Re. contents are less than 10 atomic-% or in excess of 90 atomic-% have critical temperatures of below 7° K., which are unfavorably lower than the critical temperature of Pb. or the Pb. alloy used as the electrode material of the Josephson element in the prior art. The critical temperatures of the Mo.-Re. alloys whose Re. contents are 20–80 atomic-% and 35–50 atomic-% are approximately 9° K. or above and approximately 13° K., respectively, both of which are higher than the critical temperature of Nb. in the prior art.

The base electrode may be made of a superconductive material having a high critical temperature. The critical temperature of the base electrode material should desirably be higher than that of the counter electrode material. Otherwise, the effect brought forth by forming the counter electrode especially of the aforecited material lowers. Materials preferable for the base electrode and their approximate critical temperatures (written in parentheses) are $V_3Si$. (17° K.), $V_3Ga$. (15° K.), $V_3Al$. (13° K.), $Nb_3Ga$. (20.5° K.), $Nb_3Al$. (18.7° K.), $Nb_3Si$. (9.9° K.), $Nb_3Ge$. (23° K.), $Nb_3Sn$. (18° K.), NbN. (16° K.), MoC. (13° K.) and MoN. (13° K.). It goes without saying that the Mo.-Re. alloys for the counter electrode (regarding the range of Re. content, the same as in the case of the counter electrode applies) can also be employed as the materials of the base electrode. In this case, when the counter electrode and the base electrode are made of an identical material, the manufacture is further facilitated. Any of these superconductive materials contains a transition metal element, for example, Nb., Mo. or Re. as at least part thereof.

The thickness of the counter electrode is made at least 2,000 Å, and that of the base electrode is made 1,500–2,000 Å or greater though it somewhat varies depending upon the constituent material. Less thicknesses are unfavorable because the magnetic shielding effect becomes insufficient. Although the respective electrodes do not especially have the upper limits of their thicknesses, they are seldom designed to be very thick because of miniaturizing the element, facilitating the cooling, shortening the period of time for forming the electrodes, and so on. It is often appropriate to make the counter electrode about 4,000 Å thick and the base electrode 2,000–4,000 Å thick.

In general, the barrier layer is formed of an insulating film or a semiconductor film. Particularly preferable as the barrier layer is a layer having a silicon oxide film which is obtained by the thermal oxidation of a Si. layer deposited to a thickness of 10–50 Å. Usually, the thickness of the Si. layer is made 15–30 Å. When the barrier layer is too thin, the short-circuit between the counter and base electrodes becomes more liable to occur, and when it is too thick, the tunnel effect cannot be expected. Ordinarily, the surface part of the Si. layer is turned into a Si. oxide layer by the thermal oxidation of the Si. layer, an unoxidized Si. layer being left under the Si. oxide layer so as to form a double layer consisting of the Si. oxide layer and the Si. layer. In some cases, however, the whole Si. layer is oxidized.

Any of the base electrode, the Si. film to be oxidized into the barrier layer, and the counter electrode can be formed by evaporation. The substrate temperature, that is, the temperature of a composite body consisting of the base electrode and the barrier layer at the time when the Mo.-Re. alloy of the counter electrode is evaporated may be the room temperature or lower.

A substrate for evaporating the base electrode thereon has at least its surface for the evaporation made of an insulator. Usually, $Al_2O_3$, $SiO_2$, glass, Si. whose surface is covered with an $SiO_2$ film produced by oxidation, and other various flat materials whose surfaces are covered with insulators are employed as the substrates on which the base electrodes are evaporated.

In case of employing the sandwich-type Josephson element as a logic circuit element or the like, it is generally carried out that a base electrode is deposited on a substrate formed of a ground plane overlaid with an insulating film and that a control line is disposed on the element through an insulating layer. The sandwich-type Josephson element of this invention can, of course, be put into such construction.

The sandwich-type Josephson element of this invention as above described undergoes no deterioration ascribable to the secular change or the thermal cycle because the appearance of a hillock is not noted. In addition, it can operate at a temperature higher than those of the prior-art elements, and it is permitted to operate by the cooling with the closed cycle cryogenic refrigerator in case of employing electrodes of the most preferable composition.

BRIEF DESCRIPTION OF THE DRAWINGS

FIG. 1 is a sectional view showing a sandwich-type Josephson junction element in an embodiment of this invention, while

DESCRIPTION OF THE PRESENTLY PREFERRED EMBODIMENTS

Example

Figure 1:
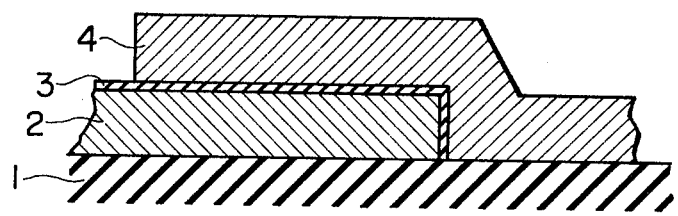

FIG. 1 is a sectional view showing a Josephson junction element in the present example. As shown in FIG. 1, the Josephson junction element in the present example is constructed of a substrate 1 which is made of $Al_2O_3$ (sapphire), a base electrode 2 which is formed of a $V_3Si$. film, a barrier layer 3 which is formed of a Si. oxide film or a double film consisting of a Si. oxide film and a Si. film, and a counter electrode 4 which is made of a Mo.-Re. alloy. It was produced as stated below.

While heating to about 900° C. the substrate 1 which was made of $Al_2O_3$ and whose surface was clean, $V_3Si$. was deposited on the substrate through a metal mask of Mo. in a predetermined pattern to a thickness of about 4,000 Å by the vacuum evaporation. Thus, the base electrode 2 was formed. In the evaporation, V. and Si. were vaporized from individual and independent vaporization sources in a vacuum of $10^{-5}$ Pa, and the vaporizing rates of the respective materials were fixed thereby to make the evaporated film uniform (such evaporation process is called the co-evaporation technique, and is a well-known art).

Subsequently, the substrate temperature was made about 300° C., and using the electron-beam heating, Si. was deposited through the metal mask to a thickness of 20–30 Å by the vacuum evaporation. Thereafter, the substrate temperature was made 40° C., oxygen was introduced to establish an oxygen atmosphere under 1 atm., which was held for 1 hour so as to turn a surface layer of the evaporated Si. film into Si. oxide. Thus, the barrier layer 3 was formed. Since the identical metal mask was used for the evaporation of the $V_3Si$. layer and the evaporation of the Si. layer, the positions of both the layers were coincident without misregistration.

Subsequently, the substrate 1 provided with the base electrode 2 and the barrier layer 3 as above described was mounted on a substrate holder cooled with liquid nitrogen, and a Mo.-Re. alloy containing 42 atomic-% of Re. was evaporated on the substrate through a metal mask of Mo. in a predetermined pattern to a thickness of about 4,000 Å by the co-evaporation technique. Thus, the counter electrode 4 was formed. The metal mask in this case was different from the metal mask used for evaporating the $V_3Si$. layer and the Si. layer.

The respective electrodes of the Josephson element fabricated as stated above were formed with In. electrodes by evaporation, and characteristics as the Josephson element were measured. As a result, the sandwich-type Josephson element in the present example did not undergo the deterioration of the characteristics ascribable to the microshort, it exhibited D.C. voltage-current characteristics suitable for a switching element, and it was quite free from the deterioration of the characteristics ascribable to the thermal cycle or to standing in the air. Josephson characteristics and superconducting tunneling characteristics could be measured up to 9°–10° K. The critical temperature of the counter electrode was approximately 13° K.

Figure 2:
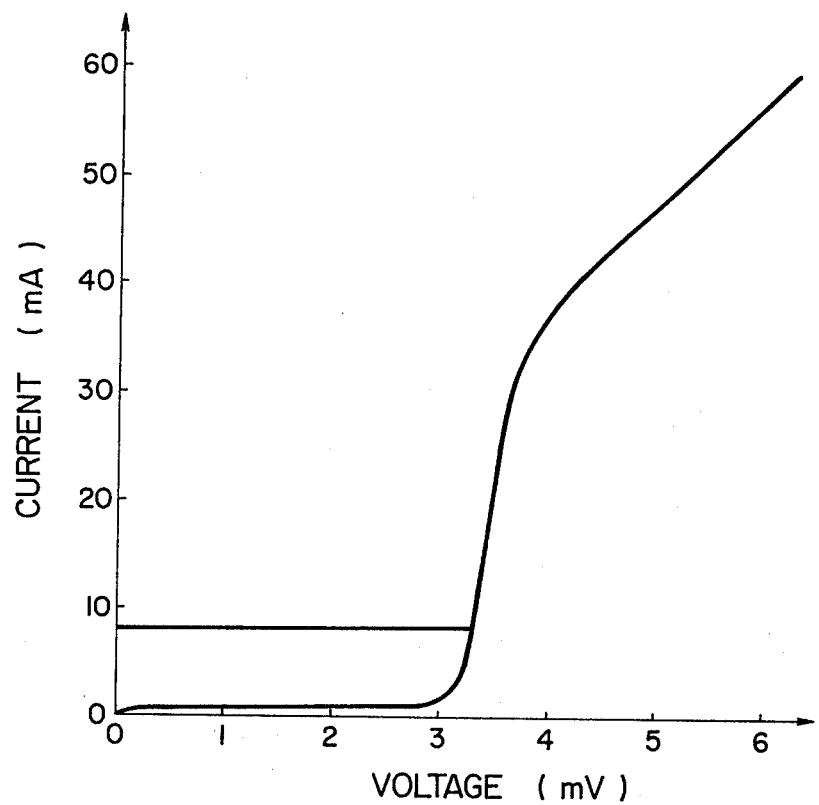
FIG. 2 is a graph showing the current-voltage characteristics of a sandwich-type Josephson junction element in an embodiment of this invention.

FIG. 2 is a graph showing the relationship between the current and the voltage of the sandwich-type Josephson element in the present example.

It is based on the following reason that the Josephson junction operable at about 10° K. has been permitted to be formed by the combination of the superconductive materials in this invention. Regarding superconductive materials of high critical temperatures such as $Nb_3Ge$. and $Nb_3Sn$., the substrate temperature during evaporation needs to be made 500° C. or above in order to attain the high critical temperatures inherent to the respective materials. This is because the crystallization temperatures of these materials are high and because the critical temperature is dependent upon the degree of atomic arrangement, a substrate temperature of 500°–1,000° C. being required in order to enhance the degree of atomic arrangement. When a superconductive film of such material to serve as a counter electrode is evaporated on a thin oxide layer of or below 10 nm at the temperature of or above 500° C., the barrier layer and the superconductive film react, and it becomes impossible to obtain the structure shown in FIG. 1. Granting that it is possible, pinholes appear in the barrier layer, or characteristics in the interface between the superconductive film and the barrier layer degrade, so that satisfactory tunneling characteristics are not attained. Accordingly, the counter electrode film needs to be made of a material which can exhibit the inherent critical temperature thereof even when produced at a substrate temperature of the room temperature or below or at most 100° C. Regarding the Mo.-Re. alloy films in this invention, even films evaporated at substrate temperatures of or below the room temperature were found to be crystallized according to an X-ray diffraction measurement and exhibited critical temperatures of 12°–13° K.

The Mo.-Re. alloy can be evaporated at the substrate temperature of or below the room temperature as described above. When a Mo.-Re. film is therefore used also as a base electrode film, there is the advantage that an ordinary resist film whose heat resistance is comparatively low can be employed as a lift-off material in the patterning based on the lift-off method.

What is claimed is:

1. In a sandwich-type Josephson junction element having a base electrode which is made of a superconductive material, a barrier layer which is formed of an insulating film and/or semiconductor film disposed on the base electrode, and a counter electrode which is made of a superconductive material disposed on the barrier layer, a Josephson junction element characterized in that said counter electrode is made of a Mo.-Re. alloy which contains 10 to 90 atomic-% of Re.

2. A Josephson junction element as defined in claim 1, characterized in that said Mo.-Re. alloy contains 20 to 80 atomic-% of Re.

3. A Josephson junction element as defined in claim 1, characterized in that said Mo.-Re. alloy contains 40 to 50 atomic-% of Re.

4. A Josephson junction element as defined in claim 1, 2 or 3, characterized in that said base electrode is made of the superconductive material which has a critical temperature equal to or higher than that of said Mo.-Re. alloy forming said counter electrode.

5. A Josephson junction element as defined in claim 1, 2 or 3, characterized in that at least part of the material forming said base electrode is a transition metal element.

6. A Josephson junction element as defined in claim 1, 2 or 3, characterized in that the material forming said base electrode is one superconductive material selected from the group consisting of $V_3Si$., $V_3Ga$., $V_3Al$., $Nb_3Ga$., $Nb_3Al$., $Nb_3Si$., $Nb_3Ge$., $Nb_3Sn$., NbN., MoC., MoN., and a Mo.-Re. alloy which contains 10 to 90 atomic-% of Re.

7. A Josephson junction element as defined in claim 1, 2 or 3, characterized in that the material forming said base electrode is the same Mo.-Re. alloy as the superconductive material forming said counter electrode.

8. A Josephson junction element as defined in claim 1, 2, 3, 4, 5, 6 or 7, characterized in that at least part of a material forming said barrier layer is a Si. oxide.

* * * * *